United States Patent [19]

Kubo et al.

[11] Patent Number: 5,894,278

[45] Date of Patent: *Apr. 13, 1999

[54] SHIELD PLATE, ELECTRONIC APPLIANCE EQUIPPED WITH SHIELD PLATE, REMOTE CONTROL SYSTEM FOR ELECTRONIC APPLIANCE, AND SHIELDING APPARATUS

[75] Inventors: Satoko Kubo; Ryota Katsumata, both of Tokyo, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/926,151

[22] Filed: Sep. 9, 1997

Related U.S. Application Data

[63] Continuation of application No. 08/413,619, Mar. 30, 1995, abandoned.

[30] Foreign Application Priority Data

Apr. 7, 1994 [JP] Japan ................................. 6-069428

[51] Int. Cl.$^6$ ..................................................... A04B 10/00
[52] U.S. Cl. ............................. 340/825.72; 340/825.56; 340/825.69; 348/734; 359/142; 359/145; 455/151.1
[58] Field of Search ..................... 340/825.72, 825.69; 348/734; 359/142, 145, 148

[56] References Cited

U.S. PATENT DOCUMENTS

| | | | |
|---|---|---|---|
| 4,262,365 | 4/1981 | George | 455/603 |
| 5,123,046 | 6/1992 | Levine | 380/10 |
| 5,151,789 | 9/1992 | Young | 358/194.1 |
| 5,349,460 | 9/1994 | Ogasahara et al. | 359/142 |
| 5,477,275 | 12/1995 | Toyoshima et al. | 348/554 |
| 5,545,891 | 8/1996 | Smith | 250/214 AL |
| 5,550,642 | 8/1996 | Kim et al. | 348/734 |

*Primary Examiner*—Michael Horabik
*Assistant Examiner*—Yonel Beaulieu
*Attorney, Agent, or Firm*—Jay H. Maioli

[57] ABSTRACT

In a remote control system used in a plurality of electronic appliances equipped with radio communication circuits operable within the same frequency band, interference of radio communication between specific electronic appliances can be prevented by employing a shielding apparatus. The remote control system comprises a plurality of electronic appliances equipped with radio communication circuits operable within the same frequency band; and a shielding member arranged between specific electronic appliances among the plural electronic appliances, for shielding a communication signal derived from the communication circuit of another electronic appliance. The shielding member is formed in a transparent plate shape, or a semitransparent plate shape, into which an absorbing agent for absorbing the signal from the communication circuit has been mixed.

12 Claims, 8 Drawing Sheets

1

SHIELD PLATE, ELECTRONIC APPLIANCE EQUIPPED WITH SHIELD PLATE, REMOTE CONTROL SYSTEM FOR ELECTRONIC APPLIANCE, AND SHIELDING APPARATUS

This is a continuation of application Ser. No. 08/413,619 filed Mar. 30, 1995, now abandoned.

BACKGROUND OF THE INVENTION

1. Field of the Invention

The present invention relates to a shield plate, an apparatus equipped with this shield plate, an electronic appliance assembled with this shield plate in an integral body, and a remote control system for such an electronic appliance equipped with this shield plate. More specifically, the shield plate of the present invention has an improved structure in order that when there are provided a plurality of electronic appliances including such communication means using radio signals within the same frequency band, for example, infrared communication signals, one communication signal used between specific electronic appliances does not interfere with the communication signals of other electronic appliances.

2. Description of the Related Art

FIG. 12 schematically represents one conventional remote control system 1 arranged by a plurality of electronic appliances equipped with the communication means for transmitting/receiving the radio signals having the frequencies in the same frequency band, for instance, infrared communication signals. This remote control system 1 is constructed of a television receiver main body 2 equipped with the infrared light receiving unit, the VCR 3, the cable box 4, the cable box controller 5, and the remote control apparatus 6. The television receiver main body 2 displays not only the TV picture of the specific TV channel selected from the TV signals received from the antenna 7, but also the cable TV picture derived from the cable 8 for the cable television.

The cable box controller 5 transmits the signal in the infrared form produced based on a predetermined format from the television receiver main body 2, and has such a structure equipped with the infrared light emitting unit 10. This cable box controller 5 is connected via the communication signal cable for transmitting the infrared code to the output terminal of the television receiver main body 2.

The cable 8 for the cable television receiver is connected to the cable box 4, and the infrared light receiving unit 9 at a preselected position of this cable box 4.

On the other hand, the antenna 7 is connected to the VCR 3, and the picture (video) cable from this VCR 3 is connected to the input terminal of the television receiver main body 2.

In the remote control system 1 for the electronic appliance with the above-described arrangement, for instance, when the remote control apparatus 6 is operated with reference to the character information and the like displayed on the television receiver main body 2, the infrared communication signals 12a and 12b are received by the infrared light receiving unit 11 provided on the side of the television receiver main body 2, so that either a predetermined picture is displayed, or such an infrared communication signal 12c is transmitted to the cable box 4, thereby displaying the picture of the designated cable television, when the cable television is designated. This infrared communication signal 12c is transmitted from the output terminal to the cable box

2 controller 5, and has been converted into the signal cable of controlling the cable box 4 from this cable box controller 5.

However, the above-explained conventional remote control system owns such a problem that the infrared coded signal derived from the remote control apparatus 6 may interfere with the communication signal in the infrared form derived from the cable box controller 5 utilized in the cable television receiver, resulting in interference conditions.

This interference problem could be solved by the prior art system as described in Japanese Laid-open Patent Application No. 2-2225 opened in 1990. The structure of this conventional system is schematically shown in FIG. 13. That is, in order to avoid such a problem that when the infrared rays of the plural remoter controllers may interfere with each other, the operation of the own unit cannot be performed, the spectroscopes 31A, 31B and the slit plates 32A, 32B are positioned in the light receiving unit 30.

There is another prior art system as disclosed in Japanese Laid-open Patent Application No. 6-112664 opened in 1994. The construction of this prior art system is shown in FIG. 14 and FIG. 15. That is, in order to avoid that the remote control signal emitted from the inside of the AV rack 33 interferes with the externally incoming remote control signal, the door 34 of the AV rack 33 is made of the material capable of reflecting the infrared remote control signal so as not to externally enter the remote control signal. This infrared reflecting structure is made by, for instance, the infrared shielding film 35, the glass 36, and the magic mirror 37.

Further, the control system arranged by the infrared transmitting/receiving unit having a plurality of light receiving units, and by a plurality of electronic appliances connected to this infrared transmitting/receiving unit is known from U.S. Pat. No. 4,897,883 and U.S. Pat. No. 4,864,647.

However, even when the above-described improved prior art system is employed, the physical positional relationship between the electronic appliances using the infrared communication signals should be taken into account in order that, for instance, the infrared communication signal used between the remote control unit and the cable box controller does not interfere with the infrared communication signals used in other electronic appliances. In other words, there is such a problem with respect to the operations of the remote control unit, that the operability and the operating range of the remote control unit employed in the conventional - - - system are greatly restricted.

As a consequence, when a plurality of electronic appliances equipped with, for example, the infrared communication means operable in the same frequency range are provided in the system, this system must avoid such a problem that the infrared communication signals used among these electronic appliances will interfere with each other by employing a simple arrangement.

SUMMARY OF THE INVENTION

To solve the above-described problems, a shield plate according to the present invention is formed in a plane plate shape and made of either a transparent resin, or a semitransparent resin, into which absorbing agent for absorbing radio signals, e.g., infrared light, with the same frequency band has been mixed. Then, this shield plate is positioned between specific electronic appliances among a plurality of electronic appliances equipped with the infrared communication means.

When a plurality of electronic appliances are provided which are equipped with infrared communication means, this shield plate is assembled into a specific electronic appliance.

Further, a shielding apparatus equipped with this shield plate is constructed of a base plate, and a shield plate standing on the base plate. This shielding apparatus is properly arranged between the specific electronic appliances among a plurality of electronic appliances equipped with, for instance, infrared communication means. This shield plate is formed by a transparent resin, or a semitransparent resin in a plate shape, into which an infrared absorbing agent has been mixed. This shield plate is detachably mounted on the base plate, or may be formed in one body with the base plate.

Then, a remote control system for an electronic appliance having this shielding apparatus is so arranged that the shielding apparatus is provided between specific electronic appliances among a plurality of electronic appliances equipped with the infrared communication means, and the specific electronic appliances are remote-controlled by a control apparatus.

The shield plate can be simply arranged without any special means between specific electronic appliances among a plurality of electronic appliances equipped with the radio signal, for instance, infrared communication means operable within the same frequency range.

The shield plate is assembled with the specific electronic appliance in an integral form, so that even when there are provided plural electronic appliances equipped with the infrared communication means, it is possible to prevent interference caused by the infrared communication signals from other electronic appliances.

Furthermore, the shielding apparatus is constructed of the base plate and the shield plate standing on this base plate, so that this shielding apparatus can be properly arranged between the specific electronic appliances equipped with the infrared communication means.

Then, in such a remote control system arranged by a plurality of electronic appliances equipped with infrared communication means, and also the remote control apparatus, the shielding apparatus is positioned between the specific electronic appliances, so as to prevent interference with the communication signal produced from the remote control apparatus.

As previously described, the shield plate according to the present invention can prevent interference between the infrared communication of the specific electronic appliance and the infrared communications by other electronic appliances in case that a plurality of electronic appliances are employed which are equipped with the infrared communication means operable within the same frequency band.

The shield plate is made transparent, or semitransparent, so that the character representation of the display unit provided near the infrared light receiving unit to be shielded can be seen through this shield plate. Thus, operability of the system is not disturbed and also this shield plate may be freely arranged at the communication units of the specific electronic appliances.

Since the shielding apparatus is detachably arranged between the specific electronic appliances for communicating with each other by infrared light to cover the communication units, the interference occurred between the infrared communication made between the specific electronic appliances, and the infrared communications among the electronic appliances can be prevented by such a very simple structure. Since this shielding apparatus is detachably provided, it is very simply performed to shield the infrared light.

In the electronic appliance into which the shield plate has been assembled in an integral form, the infrared communication unit may be properly arranged without requiring another shielding member.

Then, in the remote control system for such an electronic appliance having the shielding apparatus, there is such a great effect that the communication between the specific electronic appliances for constituting this system can be maintained under normal condition without any interference occurred in the operation of the electronic appliance under remote control.

BRIEF DESCRIPTION OF THE DRAWINGS

The present invention will now be described further by way of an example only and with reference to the accompanying drawings, in which.

DETAILED DESCRIPTION OF PREFERRED EMBODIMENTS

Figure 1:
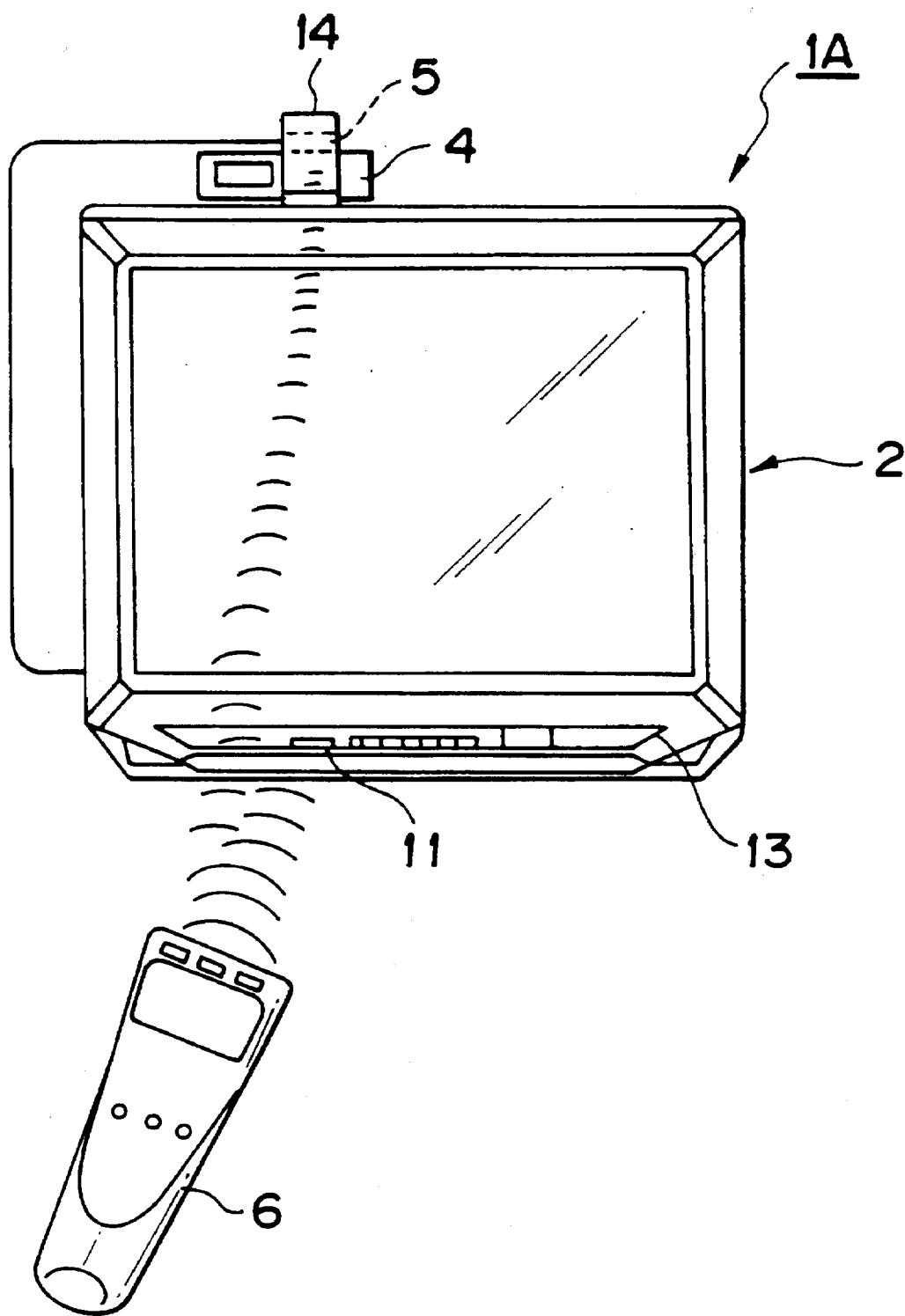
FIG. 1 schematically illustrates an overall arrangement of a remote control system of an electronic appliance employing a shielding apparatus according to a first embodiment of the present apparatus.

With respect to a shield plate, an apparatus equipped with this plate, and an electronic appliance system according to the present invention, a description will now be made of a remote control system for an electronic appliance, and a shielding apparatus according to an embodiment of the present invention. It should be noted that the same reference numerals shown in the related art are employed as those for indicating the same, or similar components in the following drawings for easy understandings.

Figure 12:
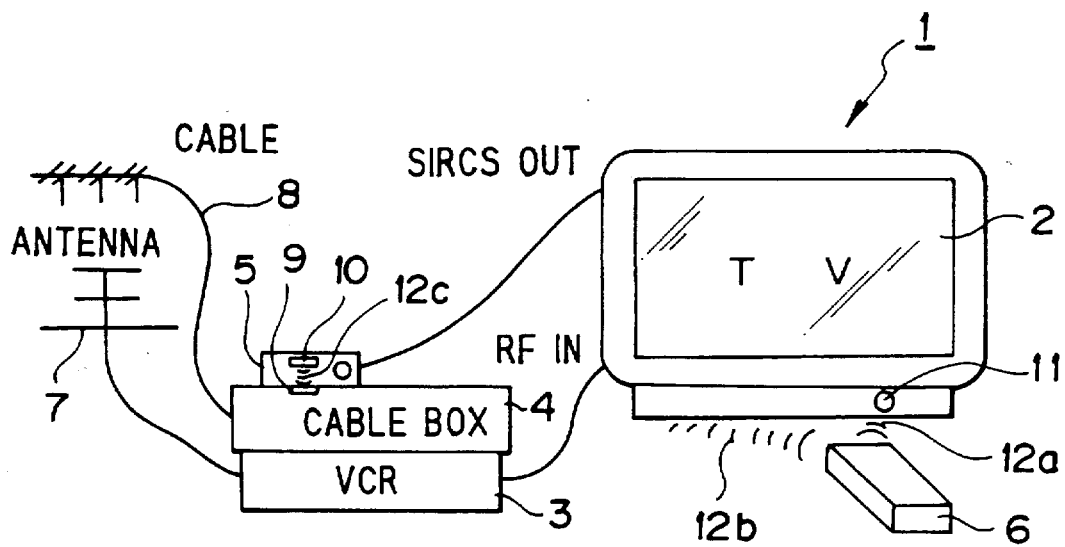
FIG. 12 explanatorily shows the overall arrangement of the remote control system in the related art for the electronic appliance.
Figure 13:
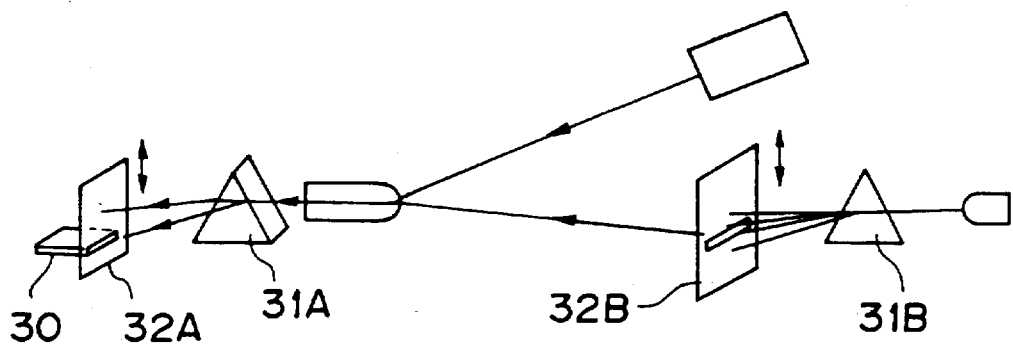
FIG. 13 is an explanatory diagram for representing the prior art.
Figure 14:
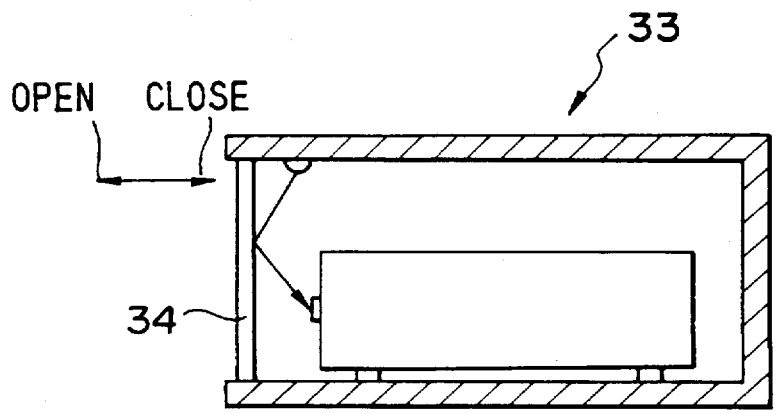
FIG. 14 is an explanatory diagram for representing the prior art.
Figure 15:
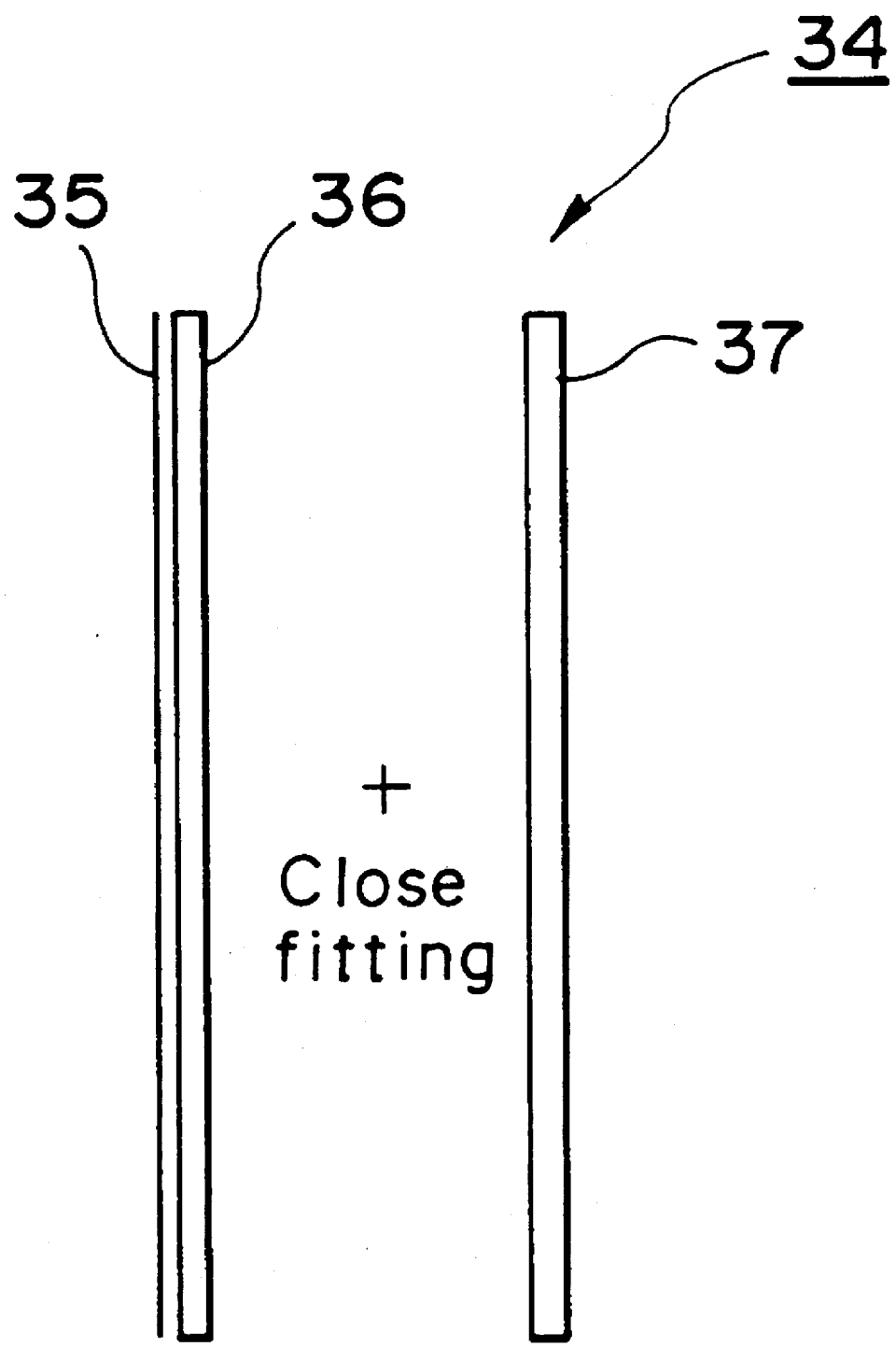
FIG. 15 is an explanatory diagram for indicating the structure of the door shown in FIG. 14.

A remote control system 1A of an electronic appliance, shown in FIG. 1 according to a first embodiment of the present invention, is arranged by, for instance, a main body of a television receiver 2, a tuner unit 13, a cable box 4, a cable box controller 5, and a shielding apparatus 14. It should also be noted that since the circuit arrangement for receiving the radio video signal of the television receiver is identical to that of the related art as explained in FIG. 12, the explanations thereof are omitted.

The television receiver main body 2 is constructed of such a display means as a CRT display or a liquid crystal display capable of displaying a picture. This television receiver main body 2 is connected to the tuner unit 13, and via a terminal provided at a preselected position to the cable box controller 5.

The tuner unit 13 is equipped with a remote control apparatus 6, and communication means for transmitting/receiving a radio signal operable within the same frequency band (infrared light will be employed). The tuner unit 13 selects the TV broadcasting channels and the cable TV broadcasting channels. This tuner unit 13 is equipped with an infrared light receiving unit 11 for receiving an infrared signal from the remote control apparatus 6.

Figure 2:
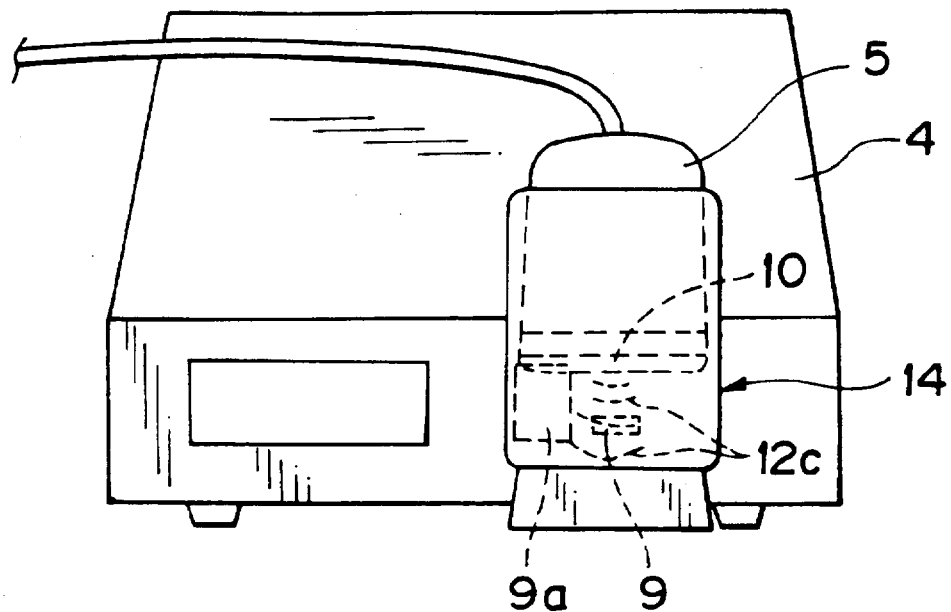
FIG. 2 is an explanatory diagram for mainly showing a condition that the shielding apparatus of the first embodiment is arranged.
Figure 3:
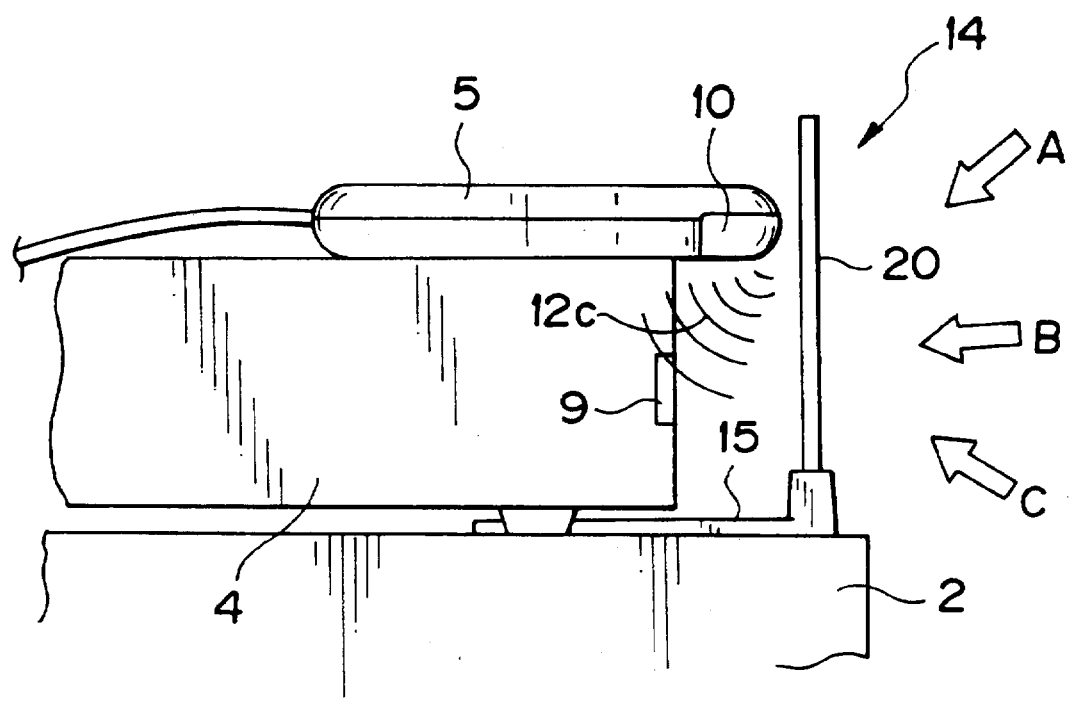
FIG. 3 is another explanatory diagram for mainly indicating a condition that the shielding apparatus of the first embodiment is arranged.

As represented in FIG. 1, and mainly FIG. 2 and FIG. 3, the cable box 4 is provided with the cable box controller 5 and the infrared communication means. The cable box 4 is used to select the cable television broadcasting channel, the input unit of which is connected to a cable TV terminal. An infrared light receiving unit 9 is positioned at a proper location of this cable box 4. This cable box 4 is located near the television receiver main body 2, for example, mounted on an upper portion of this television receiver main body 2.

The cable box controller 5 is employed to transmit an infrared communication signal 12c for the cable box 4, which is received on the side of the television receiver main body 2. As infrared light emitting unit 10 is provided at a proper position of this cable box controller 5.

Figure 4:
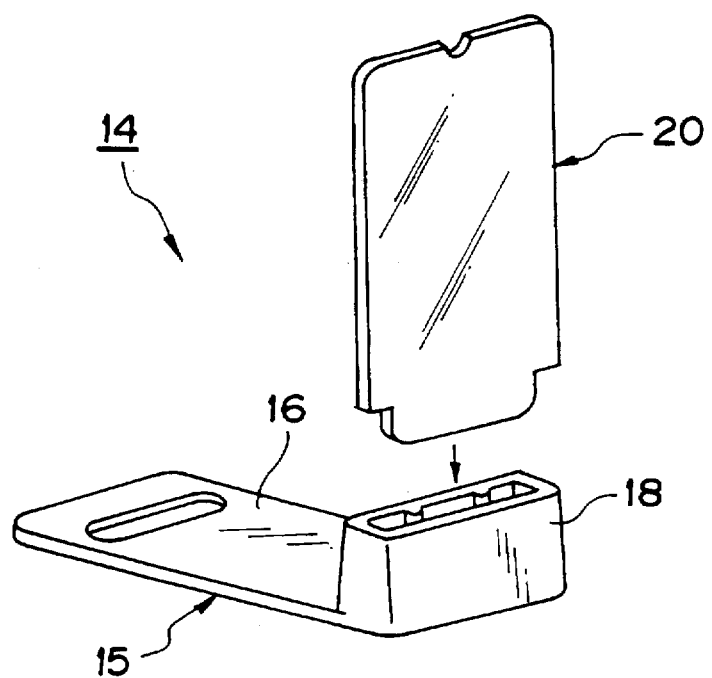
FIG. 4 is a perspective view for representing a construction of the shielding apparatus of the first embodiment.
Figure 5:
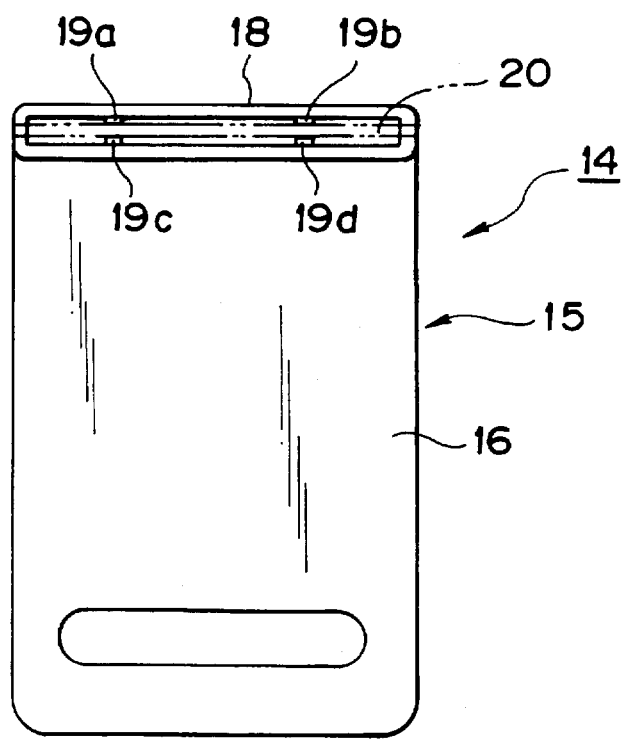
FIG. 5 is a plan view of the shielding apparatus of the first embodiment.

As represented in FIG. 3, and mainly FIG. 4 and FIG. 5, the shielding apparatus 14 is constructed of a base plate 15 and a shield plate 20 functioning as a shielding member.

The base plate 15 is arranged by a board 16 and an engaging portion 18. The board 16 is made in a plane rectangular shape, and has such a structure that the engaging portion 18 is provided at an edge portion of this board 16, with which the shield plate 20 functioning as the shielding member is detachably engaged under vertical condition.

A width of the engaging portion 18 is substantially wider than a thickness of the shield plate 20, as indicated in FIG. 4 and mainly FIG. 5. Ribs 19a, 19b, 19c and 19d are formed on both sides of this engaging portion 18 along its longitudinal direction, by which both sides of the shield plate 20 are depressed when the shield plate 20 is inserted into the engaging portion 18. These ribs 19a, 19b, 19c, 19d own such a structure that the inserted shield plate 20 may be stood in a stable condition, and the engaging portion 18 formed on the edge portion of the board 16 is reinforced.

Also, as shown in FIG. 4, the shield plate 20 is made in a plane rectangular shape, and of a transparent, or semi-transparent resin containing absorbing agent capable of absorbing infrared rays, for instance, an acrylic material and the like which can absorb infrared rays having wavelengths of 950 nm to 970 nm, and contains dye.

The shielding apparatus 14 with the above-described structure is assembled in such a manner that while the shield plate 20 functioning as the shielding member is inserted under vertical condition with respect to the base plate 15, this shielding apparatus 14 is assembled. Then, as represented in FIG. 3, the assembled shielding apparatus 14 is provided at the front surfaces of the cable box 4 and the cable box controller 5, which are positioned on the upper portion of the television receiver main body 2, for instance. In other words, while the transmitting/receiving operations of the infrared communication signals between the cable box 4 and the cable box controller 5 are maintained, other infrared communication signals employed in other communication means can be shielded by this shielding apparatus 4.

As a consequence, as represented in FIG. 3, the infrared communication signal 12c transmitted from the cable box controller 5, which is produced at the left side position of the shield plate 20, is sent to the cable box 4, and also absorbed by the shield plate 20, so that the infrared communication signal which is directed to the right side direction of the shielding apparatus 14 can be shielded.

At the same time, the infrared signals (arrowed directions A, B, C) produced from the remote control apparatus 6 for controlling the operations of the television receiver main body 2 can be similarly shielded.

As a result, even if such an infrared communication signal having the same frequency range as that produced from, for example, the remote control apparatus would be produced, other infrared communication signals produced from other communication means can be shielded by the shielding apparatus 14.

Also, as shown in FIG. 2, since the shield plate 20 of the shielding apparatus 14 is transparent, or semitransparent, for instance, the channel number represented on the channel display unit 9a can be observed through the shield plate 20, so that this shield plate 20 does not give any adverse influence to operability.

Furthermore, since this shield plate is detachably positioned between the specific electronic appliances, the infrared communication signal shielding operation can be easily modified. For instance, a plurality of infrared communication signals may be received in accordance with a selected priority order.

This may be effectively achieved in the following communication conditions in the positional relationship between the cable box 4 and the cable box controller 5. That is, in the infrared communication signal transmitting/receiving means, the infrared communication signals having a certain limited wavelength are transmitted/received under a certain limited condition.

In other words, the received infrared communication signals can be always processed as the signals transmitted from the cable box controller in the cable box 4. As a result, not only the circuit group can be made simply, but also the signal reproducing/controlling system can be simplified. Moreover, this construction can be achieved by employing the shielding apparatus 14 with such an extremely simple structure.

Figure 6:
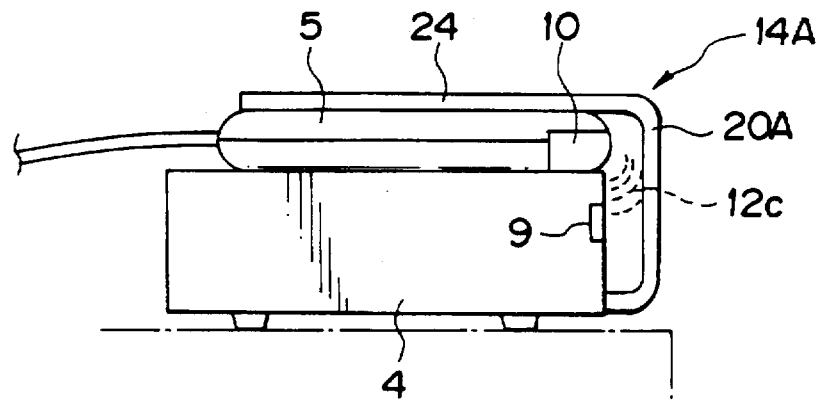
FIG. 6 schematically illustrates another shielding apparatus according to a second embodiment of the present invention, which is located on an electronic appliance.
Figure 7:
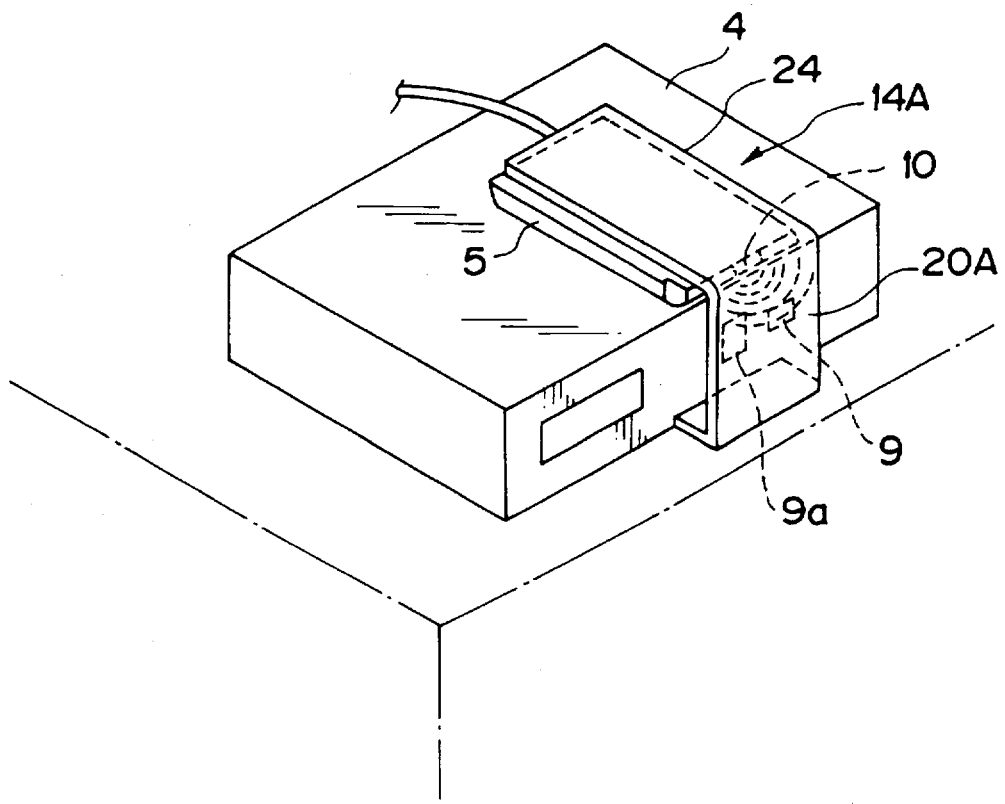
FIG. 7 is a perspective view for showing the shielding apparatus of the second embodiment.

Referring again to the drawings, another shielding apparatus according to a second embodiment of the present invention will be described. FIG. 6 schematically shows a positional relationship of a shielding apparatus 14A in which a base plate and a shield plate are formed in an integral form. That is, the cable controller 5 is positioned on the cable box 4, and the shielding apparatus 14 is located so as to externally shield the infrared communication portions provided in both of the cable box 4 and the cable box controller 5. FIG. 7 is a perspective view for mainly showing this shielding apparatus 14A according to the second embodiment of the present invention.

This shielding apparatus 14A is constructed of a base unit 24 corresponding to the base plate, and a shield plate 20A, and is made of a resin or the like in a plane plate shape. These constructive elements are made in an integral form. The shield plate 20A is fabricated under such a condition that the shield plate 20A is vertically bent with respect to the base unit 24. Then, a portion of this shield plate 20A is made of a transparent resin, or a semitransparent resin, into which the infrared absorbing agent has been mixed.

It should be noted that both of the base unit 24 and the shield plate 20A may be manufactured in a monochromatic form. Alternatively, the different resin (e.g., the infrared absorbing agent is not mixed) is used in the base unit 24, and this base unit 24 is colored, so that the base unit 24 and the shield plate 20A may be formed in two different colors.

The shielding apparatus 14A with such a structure is so arranged, as shown in FIG. 7, that the shield plate 20A is positioned to cover the portions of the infrared light receiving units 9 and 10 for the cable box 4 and the cable box controller 5.

When this infrared communication unit is sufficiently covered, it is possible to shield the infrared communication signals externally supplied. Even when a plurality of electronic appliances for performing the infrared communications are present, the infrared communication signal 12c communicated between at least specific electronic appliances, e.g., between the cable box 4 and the cable box controller 5 does not interfere with other externally supplied infrared communication signals. Since the shield plate 20A is made transparent, or semitransparent, even when the channel display unit 9a is covered, the display content of this channel display unit 9a can be observed, which never disturb operability of the electronic appliance.

It should also be noted that although the base unit 24 of the shielding apparatus 14A is mounted on the upper portion of the cable box controller 5 and the shield plate 20A is positioned under such a condition that this shield plate is hung on, like a "bamboo blind", the present invention is not limited to this embodiment. For instance, the base unit 24 is entered under the cable box 4 so that this is used like a "wooden screen".

Figure 8:
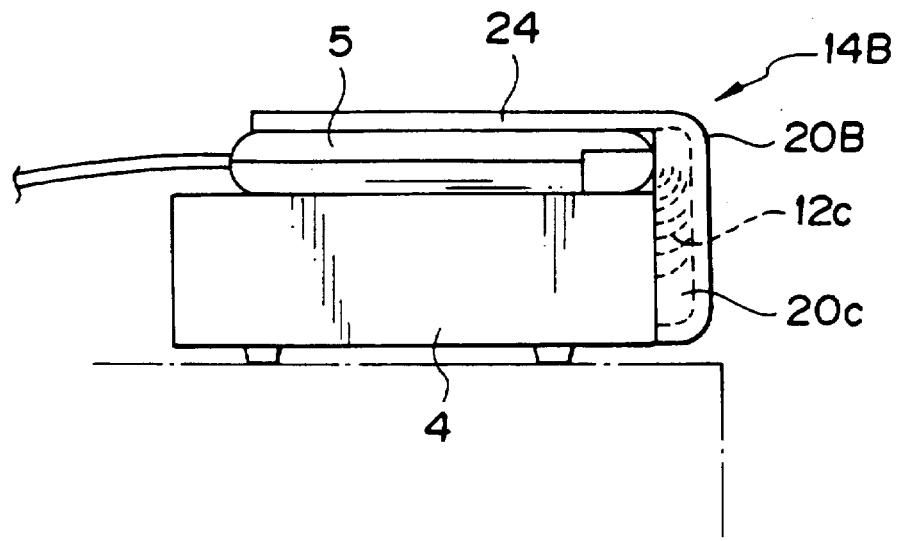
FIG. 8 schematically illustrates another shielding apparatus according to a third embodiment of the present invention, which is located on an electronic appliance.
Figure 9:
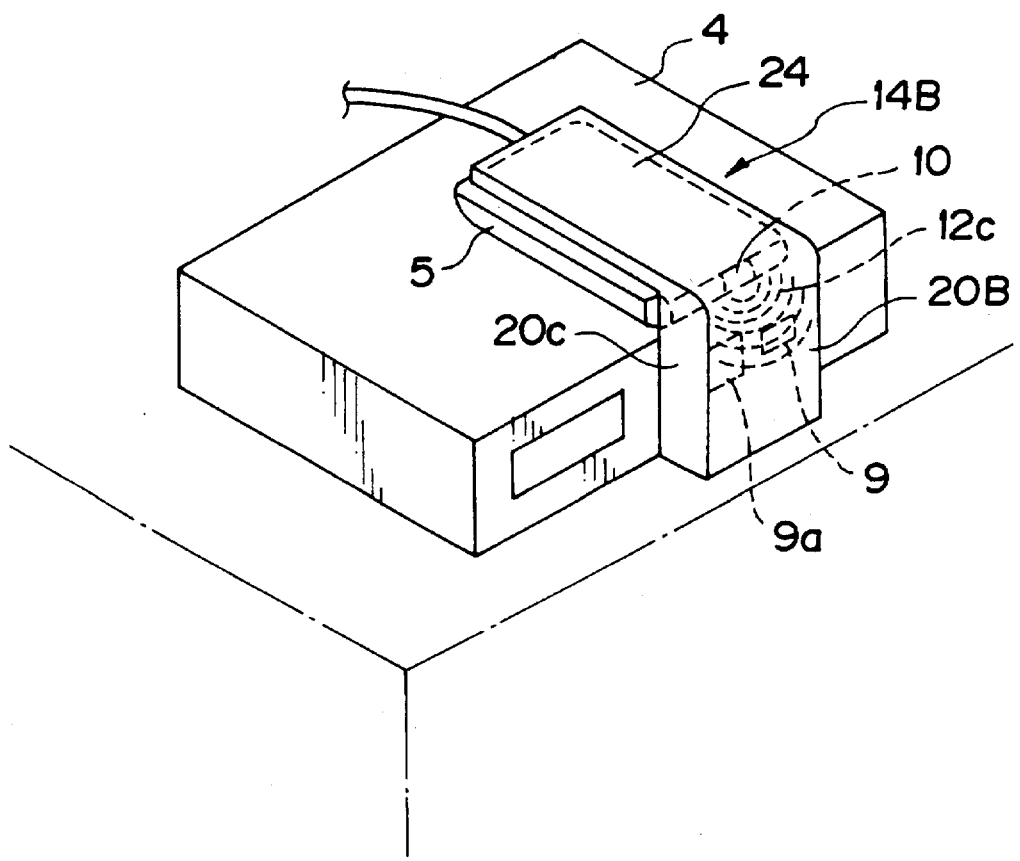
FIG. 9 is a perspective view of the shielding apparatus of the third embodiment.

Next, a description is made of a shielding apparatus according to a third embodiment of the present invention with reference to the drawings. FIG. 8 schematically shows such a condition that a shielding apparatus equipped with a shield plate having such a structure capable of covering the communication unit of the electronic appliance under essentially sealed state is arranged between the communication appliances, for example, the communication units of the cable box 4 and the cable box controller 5. FIG. 9 is a perspective view for mainly representing the shielding apparatus according to the third embodiment.

A shielding apparatus 14B is formed by employing both a base unit 24 made of a resin and the like, and a shield plate 20B in such a manner that this shield plate 20B is bent under substantially vertical condition with respect to this base unit 24 and a flange 20c is formed on the peripheral portion of the edge portion. Similar to the second embodiment, a portion of the shield plate 20B involving at least the flange 20c is made of a transparent resin, or a semitransparent resin, into which an infrared absorbing agent has been mixed.

Similar to the shielding apparatus 14A of the second embodiment, both of the base unit 24 and the shield plate 20B may be formed in an integral body with a single color. Alternatively, it is of course possible to make the base unit 24 by employing such a resin different from that of the shield plate 20B, for instance, a resin mixed with no infrared absorbing agent and having monochromatic color, so that these base unit and shield plate may have two different colors.

For instance, as shown in FIG. 9, the shielding apparatus 14B with such a structure is so arranged that the shield plate 20B is positioned to the communication units between the specific electronic appliances, for instance, the infrared light receiving unit 9 of the cable box 4 and the infrared light receiving unit 10 of the cable box controller 5 so as to cover them under substantially close condition. When the infrared communication units may be covered under substantially close state, the interference caused by the externally supplied infrared communication signals can be shielded with extremely high precision.

That is, even when the infrared communication signals are communicated among a plurality of electronic appliances equipped with the infrared communication means, if this shielding apparatus 14B is arranged between certain electronic appliances, for example, the communication units of the cable box 4 and the cable box controller 5, at least the infrared communication effected between the cable box 4 and the cable box controller 5 does not interfered with other infrared communication signals. Similar to the second embodiment, the using condition of this shielding apparatus 14B is not limited to the above-explained using condition as shown in FIG. 8 and FIG. 9.

Figure 10:
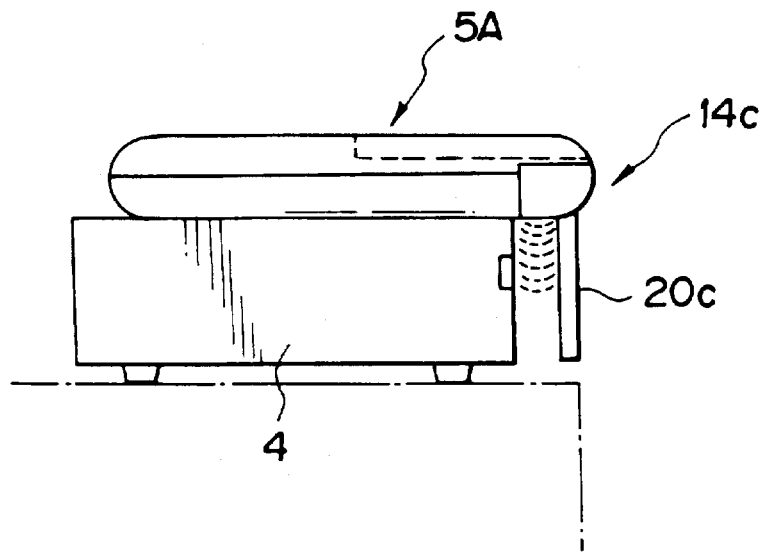
FIG. 10 schematically illustrates another shielding apparatus according to a fourth embodiment of the present invention, which is located on an electronic appliance.
Figure 11:
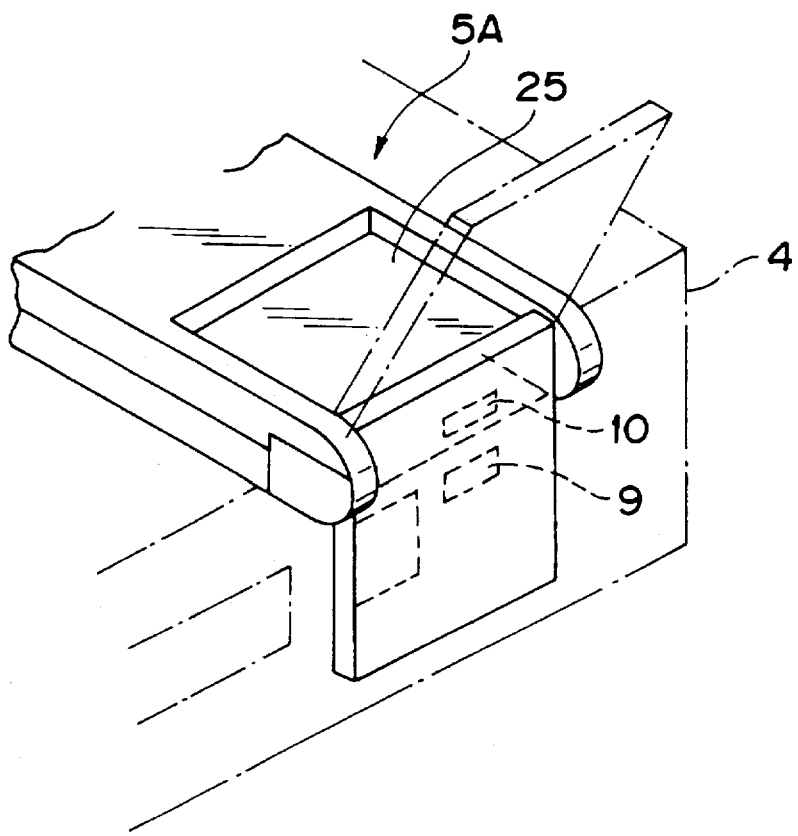
FIG. 11 is a perspective view of the shielding apparatus of the fourth embodiment.

Subsequently, a description will now be made of another shielding apparatus according to a fourth embodiment of the present invention with reference to the drawings. FIG. 10 schematically illustrates a shielding apparatus 14c assembled into a specific electronic appliance, in which a shield plate is picked up to cover communication units between electronic appliances during operation. FIG. 11 is a perspective view for mainly indicating this shielding apparatus of the fourth embodiment.

The shielding apparatus 14c assembled in the electronic appliance in an integral body has such a structure, as shown in FIG. 10 and FIG. 11, that a notch portion 25 is formed which can store therein a specific electronic appliance, for instance, a shield plate 20c in an upper portion of a cable box controller 5A, and then the shield plate 20c is pivotably assembled into this notch portion 25 in an integral body. Then, a portion of this shield plate 20c is made of a transparent resin, or a semitransparent resin, into which an infrared absorbing agent has been mixed in a similar manner to the above-described embodiments.

As illustrated in FIG. 11, the shielding apparatus 14c with such a structure is used in such a way that the shield plate 20c stored in the electronic appliance is pivoted to he hung on like "a bamboo blind", whereby this shield plate 20c may cover the communication units between the electronic appliances, for instance, the infrared light emitting unit 9 of the cable box 4 and the infrared light receiving unit 10 of the cable box controller 5A.

As a consequence, only the communication units between the specific electronic appliances can be covered by this shielding apparatus in a similar manner to the second embodiment, so that interference caused by other infrared communication signals used in other electronic appliances can be prevented.

It should be understood that the present invention is not limited to the above-described embodiments, but may be modified. For instance, the present invention may be applied to such structure/apparatus/system that when there are provided a plurality of electronic appliances equipped with radio communication means operable within the same frequency band, communication signals derived from other electronic appliances do not give any interference to a specific communication signal communicated between specific electronic appliances.

What is claimed is:

1. A remote control system comprising:

a plurality of electronic appliances in a physical proximity of each other, one of said plurality of electronic appliances being a cable box and each of said plurality of electronic appliances being equipped with an infrared receiver for receiving a distinct set of control signals;

a cable box controller electrically connected to another one of said plurality of electronic appliances for generating infrared light for communicating said distinct set of cable box command signals to said cable box;

at least a first remote controller corresponding to respective ones of said plurality of electronic appliances other than said cable box, for generating infrared light for communicating said distinct set of command signals to the respective other electronic appliances; and a shield plate assembled in an integral form with said cable box controller for shielding the cable box and cable-box controller from each infrared signal generated by said at least one remote controller, including a second remote controller for said another one of said plurality of electronic appliances, from reaching the infrared receiver of said cable box, but not shielding from the infrared receiver of said cable box an infrared signal generated by said cable box controller connected to said another one of said electronic appliances;

said shield plate being physically between said cable box and said cable box controller on one side and the respective other electronic appliances, which are in said physical proximity of said cable box and each other, on the other side;

wherein said cable box receives only said distinct set of cable box commands from said cable box controller.

2. A system as claimed in claim 1 wherein said shield plate is formed in a plate shape of a transparent material into which an absorbing agent for absorbing and preventing transmission therethrough of the infrared signal generated by said remote controllers has been mixed.

3. A system as claimed in claim 1 wherein said shield plate is made of a transparent resin.

4. A remote control system comprising:

a plurality of electronic appliances including a cable box in a physical proximity of each other, each of said plurality of electronic appliances being equipped with wireless communication means operable within the same frequency band including a corresponding receiver located at each of said plurality of electronic appliances and each of said wireless communication means operable to receive a distinct set of commands for controlling a corresponding one of said appliances;

a cable box controller electrically connected to one of said plurality of electronic appliances other than said cable box, for generating said distinct set of cable box commands for controlling said cable box;

at least one remote control unit which corresponds to respective ones of said plurality of electronic appliances other than said cable box, each of said at least one remote control unit generating a corresponding one of said distinct set of commands for controlling a corresponding one of said plurality of electronic appliances other than said cable box; and a shielding apparatus consisting of a shield plate and a base plate detachably mounted between said cable box and said cable box controller, which are in said physical proximity of said cable box and each other, on one side and the other electronic appliances and said at least one remote control unit corresponding to the respective other electronic appliances on the other side, said shield plate being formed in a plate shape of a transparent material into which an absorbing agent for absorbing and preventing transmission therethrough of a communication signal generated by the remote control unit for said other ones of said plurality of electronic appliances on the other side of the shield plate opposite the cable box is imbedded, and said base plate positioning said shield plate vertically relative to an upper surface of said cable box, wherein said cable box receives only said distinct set of cable box commands from said cable box controller.

5. A remote control system as claimed in claim 4, wherein said shield plate is detachably assembled with said base plate.

6. A remote control system as claimed in claim 4, wherein said shield plate is formed in one piece with said base plate.

7. A remote control system as claimed in claim 4, wherein said shield plate is made of a resin.

8. A remote control system as claimed in claim 4, wherein said communication signal is an infrared signal.

9. In a system including a plurality of electronic appliances and a cable box in a physical proximity of each other, each being equipped with a respective wireless communication means including a corresponding receiver operable within the same frequency band, and a cable box controller and at least one remote control unit by which said cable box and corresponding ones of said plurality of electronic appliances, respectively, are remote-controlled by signals transmitted to the respective receivers from said cable box controller and respective ones of the remote control units, said cable box controller which is electronically connected to one of said electronic appliances and the remote control units each generating distinct sets of command signals for controlling respective ones of said appliances, the improvement comprising:

a shielding apparatus positioned between said cable box and said cable box controller on one side and said specific electronic appliances, which are in said physical proximity of said cable box and each other, on the other side for physically shielding a communication signal generated by said remote control units corresponding to said specific electronic appliances from reaching the receiver of said cable box and for physically shielding a communication signal generated by said cable box controller from reaching the receivers of said specific electronic appliances, wherein each of said cable box and plurality of electronic appliances receives only the corresponding distinct set of commands.

10. A system as claimed in claim 9, wherein said shielding apparatus comprises:

a shield plate mounted adjacent said cable control box and formed in a plate shape of a semitransparent material into which an absorbing agent capable of absorbing and preventing transmission therethrouqh of the communication signal generated by said remote control unit of said specific electronic appliances is imbedded; and a base plate for positioning said shield plate vertically relative to an upper surface of said cable control box.

11. A system as claimed in claim 10, wherein said shield plate is detachably assembled with said base plate.

12. A system as claimed in claim 10, wherein said shield plate is formed in one piece with said base plate.

* * * * *